(12) United States Patent
Xiang et al.

(10) Patent No.: US 7,923,785 B2
(45) Date of Patent: Apr. 12, 2011

(54) FIELD EFFECT TRANSISTOR HAVING INCREASED CARRIER MOBILITY

(75) Inventors: Qi Xiang, San Jose, CA (US);
Boon-Yong Ang, Cupertino, CA (US);
Jung-Suk Goo, Stanford, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 70 days.

(21) Appl. No.: 10/643,461

(22) Filed: Aug. 18, 2003

(65) Prior Publication Data
US 2005/0040477 A1 Feb. 24, 2005

(51) Int. Cl.
*H01L 21/336* (2006.01)
(52) U.S. Cl. ............... 257/369; 257/E29.298; 438/285; 438/938
(58) Field of Classification Search .......... 257/369, 257/408, E29.298; 438/285
See application file for complete search history.

(56) References Cited

U.S. PATENT DOCUMENTS

| | | | |
|---|---|---|---|
| 5,557,136 A * | 9/1996 | Gordon et al. | 257/530 |
| 5,721,145 A | 2/1998 | Kusakabe et al. | |
| 6,190,975 B1 * | 2/2001 | Kubo et al. | 438/285 |
| 6,262,462 B1 | 7/2001 | Marshall et al. | |
| 6,803,266 B2 * | 10/2004 | Solomon et al. | 438/197 |
| 6,864,556 B1 * | 3/2005 | You et al. | 257/437 |
| 2002/0093046 A1 | 7/2002 | Moriya et al. | |
| 2003/0034529 A1 * | 2/2003 | Fitzgerald et al. | 257/369 |
| 2004/0002185 A1 * | 1/2004 | Takahashi | 438/224 |
| 2008/0278787 A1 * | 11/2008 | Sasagawa | 359/224 |
| 2008/0296609 A1 * | 12/2008 | Nagahama et al. | 257/103 |
| 2009/0099553 A1 * | 4/2009 | Langereis et al. | 604/891.1 |

FOREIGN PATENT DOCUMENTS

| | | |
|---|---|---|
| EP | 1 164 636 A2 | 12/2001 |
| JP | 51-150980 | 12/1976 |
| JP | 52-004789 | 1/1977 |
| JP | 62-239582 | 10/1987 |
| JP | 05082777 | 4/1993 |
| JP | 2000-223703 | 8/2000 |
| JP | 2002-100767 | 4/2002 |
| JP | 2003-086708 | 3/2003 |
| WO | WO 2004/112147 A1 | 12/2004 |

OTHER PUBLICATIONS

Wolf et al., Silicon Processing For The VLSI Era, 1986, Lattice Press, vol. 1, pp. 199 and 647.*
Ota et al, *Novel Locally Strained Channel Technique for High Performance 55nm CMOS*, IEDM Technical Digest, 27-30 (2002).

(Continued)

*Primary Examiner* — Jerome Jackson, Jr.
*Assistant Examiner* — Paul A Budd
(74) *Attorney, Agent, or Firm* — Farjami & Farjami LLP

(57) ABSTRACT

According to one exemplary embodiment, a FET which is situated over a substrate, comprises a channel situated in the substrate. The FET further comprises a first gate dielectric situated over the channel, where the first gate dielectric has a first coefficient of thermal expansion. The FET further comprises a first gate electrode situated over the first gate dielectric, where the first gate electrode has a second coefficient of thermal expansion, and where the second coefficient of thermal expansion is different than the first coefficient of thermal expansion so as to cause an increase in carrier mobility in the FET. The second coefficient of thermal expansion may be greater that the first coefficient of thermal expansion, for example. The increase in carrier mobility may be caused by, for example, a tensile strain created in the channel.

3 Claims, 4 Drawing Sheets

OTHER PUBLICATIONS

*Applying Mechanical Stress to Improve MOS Semiconductor Performance*, 30 IBM Technical Disclosure Bulletin, 330-333 (1988).

Momose et al, *Relationship Between Mobility and Residual-Mechanical-Stress As Measured By Raman Spectroscopy For Nitrided-Oxide-Gate MOSFETs*, 90 IEDM, 65-68 (1990).

Jennifer O'Connor, *Analytical Predictions of Thermal Stress in MOSFETs*, IEEE, 131-143 (1995).

Wristers et al, *Ultra Thin Oxide Reliability: Effects of Gate Doping Concentration and Poly-Si/SiO2 Interface Stress Relaxation*, IEEE, 77-83 (1996).

Steegen et al, *Suicide-induced Stress In Si: Origin and Consequences for MOS Technologies*, 38 Materials Science and Engineering R: Reports, 1-53 (2002).

* cited by examiner

FIELD EFFECT TRANSISTOR HAVING INCREASED CARRIER MOBILITY

TECHNICAL FIELD

The present invention is generally in the field of semiconductor devices. More particularly, the present invention is in the field of fabrication of semiconductor field effect transistors ("FETs").

BACKGROUND ART

A continuing demand exists for higher performance integrated circuits ("IC"), such as very large scale integrated circuits ("VLSI"). As a result, semiconductor manufacturers are challenged to increase the performance of transistors, such as n-channel field effect transistors ("NFETs") or p-channel field effect transistors ("PFETs"), which are utilized in ICs.

One important measure of field effect transistor ("FET") performance is speed, which is related to current in the FET. A typical FET includes a gate stack, which includes a gate electrode situated over a gate dielectric, a source and a drain, and a channel, which is situated between the source and the drain in a silicon substrate. The channel is also situated underneath the gate dielectric, which is situated over a substrate, such as a silicon substrate. When a voltage is applied to the gate electrode that is greater than a threshold voltage, a layer of mobile charge carriers, e.g. electrons in an NFET and holes in a PFET, is created in the channel. By applying a voltage to the drain of the FET, a current can be caused to flow between drain and source.

In the FET discussed above, the mobility of the carriers is directly related to the current that flows between the drain and the source, also referred to as FET current in the present application, which is directly related to the speed of the FET. Carrier mobility is a function of, among other things, temperature, electric field created between gate electrode and channel by the gate voltage, and dopant concentration. By increasing carrier mobility, FET current and, consequently, FET speed can be increased. Thus, as a result of increasing carrier mobility, FET performance can be desirably increased.

Thus, there is a need in the art for a FET having increased carrier mobility to achieve increased FET performance.

SUMMARY

The present invention is directed to field effect transistors ("FETs") having increased carrier mobility. The present invention addresses and resolves the need in the art for a FET having increased carrier mobility to achieve increased FET performance.

According to one exemplary embodiment, a FET, which is situated over a substrate, comprises a channel situated in the substrate. The FET further comprises a first gate dielectric situated over the channel, where the first gate dielectric has a first coefficient of thermal expansion. The FET further comprises a first gate electrode situated over the first gate dielectric, where the first gate electrode has a second coefficient of thermal expansion, and where the second coefficient of thermal expansion is different than the first coefficient of thermal expansion so as to cause an increase in carrier mobility in the FET. The second coefficient of thermal expansion may be greater that the first coefficient of thermal expansion, for example. The increase in carrier mobility may be caused by, for example, a tensile strain created in the channel.

According to this exemplary embodiment, the FET may further comprise a "gate liner" situated adjacent to the first gate dielectric and a "gate spacer" situated adjacent to the gate liner, where the gate liner has a third coefficient of thermal expansion and the gate spacer has a fourth coefficient of thermal expansion, and where the fourth coefficient of thermal expansion is greater than the third coefficient of thermal expansion so as to cause a tensile strain in the channel.

According to one exemplary embodiment, the FET may further comprise a second gate electrode situated between the first gate electrode and the first gate dielectric, where the second gate electrode has a third coefficient of thermal expansion, where the third coefficient of thermal expansion is greater than the first coefficient of thermal expansion and the third coefficient of thermal expansion is less than the second coefficient of thermal expansion so as to cause a tensile strain in the channel, and where the tensile strain causes the increase in the carrier mobility. Other features and advantages of the present invention will become more readily apparent to those of ordinary skill in the art after reviewing the following detailed description and accompanying drawings.

DETAILED DESCRIPTION OF THE INVENTION

The present invention is directed to field effect transistors ("FETs") having increased carrier mobility. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
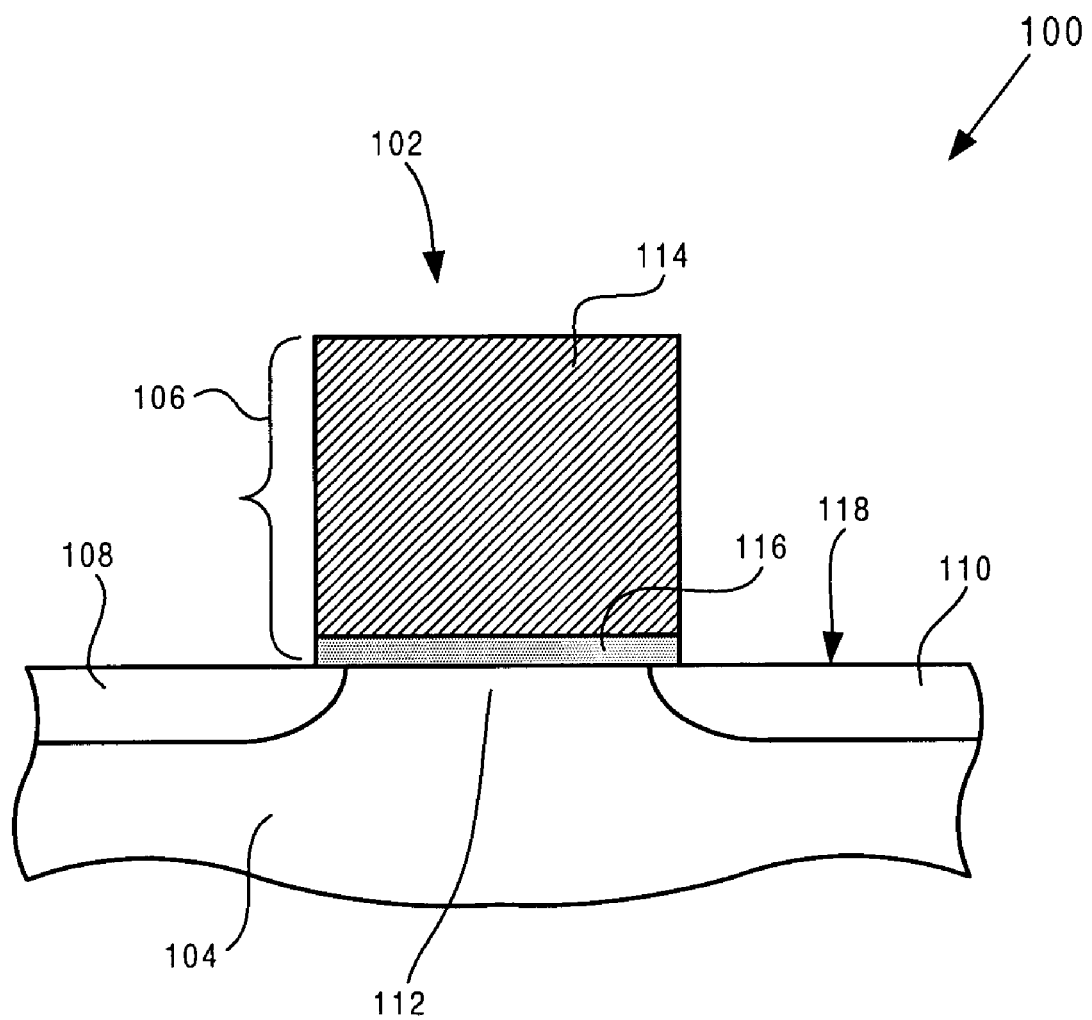
FIG. 1 illustrates a cross-sectional view of a structure, including an exemplary FET, in accordance with one embodiment of the present invention.

FIG. 1 shows a cross-sectional view of an exemplary structure including an exemplary FET in accordance with one embodiment of the present invention. Structure 100 includes FET 102, which is situated on substrate 104. FET 102 includes gate stack 106, which includes gate electrode layer 114 and gate dielectric layer 116, source 108, drain 110, and channel 112. In the present embodiment, FET 102 can be an NFET or a PFET.

As shown in FIG. 1, source 108 and drain 110, which are formed in a manner known in the art, are situated in substrate 104 and channel 112 is situated between source 108 and drain 110. Further shown in FIG. 1, gate dielectric layer 116 is situated over channel 112 on top surface 118 of substrate 104.

By way of example, gate dielectric layer 116 can have a thickness of between 10.0 Angstroms and 15.0 Angstroms. Also shown in FIG. 1, gate electrode layer 114 is situated over gate dielectric layer 116. By way of example, gate electrode layer 114 can have a thickness of between 500.0 Angstroms and 2000.0 Angstroms. Gate electrode layer 114 can be deposited over gate dielectric layer 116 at high temperature utilizing a chemical vapor deposition ("CVD") process or other appropriate processes.

In the present embodiment, gate electrode layer 114 and gate dielectric layer 116 are selected such that gate electrode layer 114 has a coefficient of thermal expansion ("CTE") that is higher than a CTE of gate dielectric layer 116. Thus, as a wafer comprising structure 100 cools down after gate electrode layer 114 has been deposited at high temperature, gate electrode layer 114 decreases in size to a greater extent (i.e. shrinks more) than gate dielectric layer 116. As a result, tensile strain is created in channel 112, which increases carrier mobility in FET 102. In one embodiment, FET 102 is a PFET while gate dielectric layer 116 and gate electrode layer 114 are selected such that gate dielectric layer 116 has a CTE that is higher than a CTE of gate electrode layer 114. In such embodiment, compressive strain is created in channel 112, which increases carrier mobility in the PFET.

Figure 2:
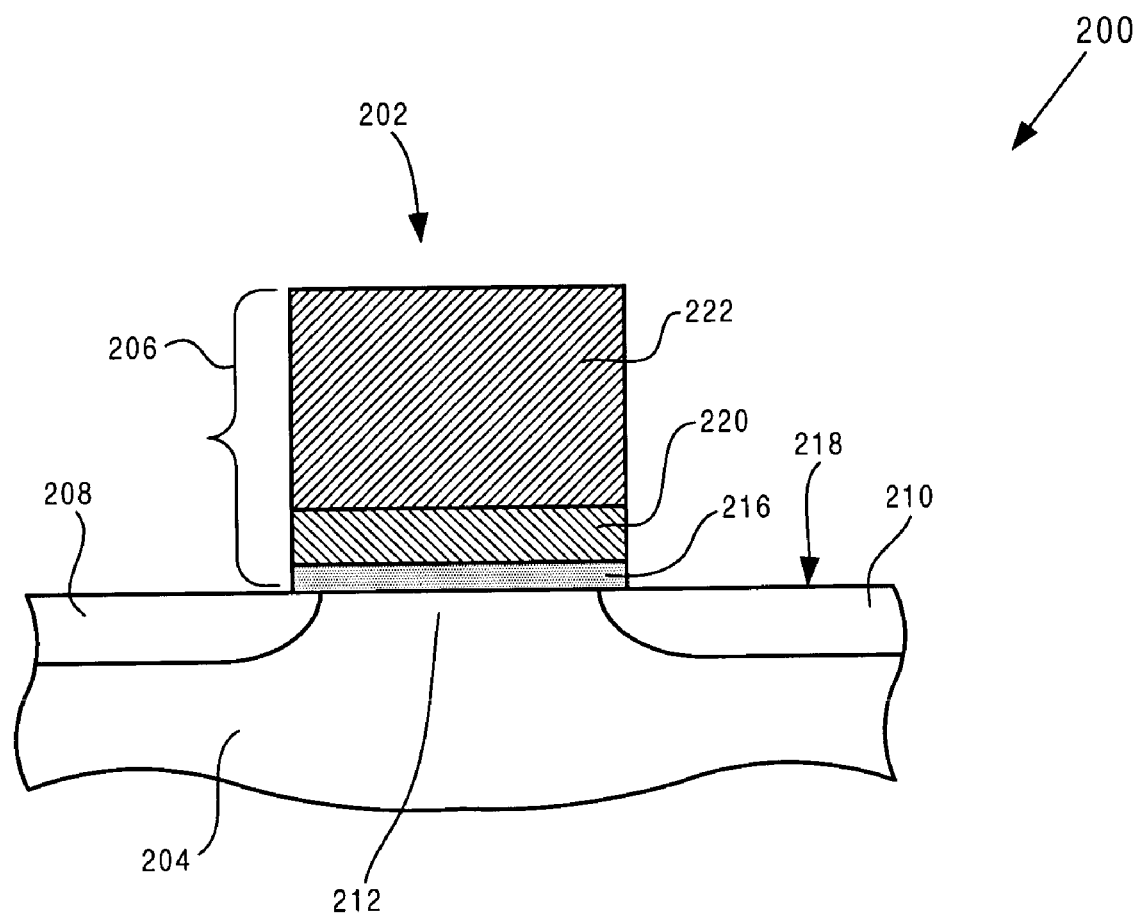
FIG. 2 illustrates a cross-sectional view of a structure, including an exemplary FET, in accordance with one embodiment of the present invention.

FIG. 2 shows a cross-sectional view of an exemplary structure including an exemplary FET in accordance with one embodiment of the present invention. Structure 200 includes FET 202, which is situated on substrate 204. FET 202 includes gate stack 206, which includes gate electrode layers 218 and 220 and gate dielectric layer 216, source 208, drain 210, and channel 212. Similar to FET 102, FET 202 can be an NFET or a PFET. In structure 200 in FIG. 2, substrate 204, source 208, drain 210, and channel 212 correspond, respectively, to substrate 104, source 108, drain 110, and channel 112 in structure 100.

As shown in FIG. 2, gate dielectric layer 216 is situated over channel 212 on top surface 218 of substrate 204. By way of example, gate dielectric layer 216 can have a thickness of between 10.0 Angstroms and 15.0 Angstroms. Also shown in FIG. 2, gate electrode layer 220 is situated over gate dielectric layer 216 and may comprise, for example, polycrystalline silicon or other appropriate material. By way of example, gate electrode layer 220 can have a thickness of between 100.0 Angstroms and 500.0 Angstroms. Further shown in FIG. 2, gate electrode 222 is situated over gate electrode 220 and may comprise, for example, silicide or other appropriate material. By way of example, gate electrode layer 220 can have a thickness of between 400.0 Angstroms and 1500.0 Angstroms. Gate electrode layer 220 can be deposited over gate electrode layer 220 at high temperature utilizing a CVD process or other appropriate processes.

In the embodiment of the present invention in FIG. 2, gate electrode layers 220 and 222 and gate dielectric layer 216 are selected such that gate electrode layer 222 has a CTE that is higher than a CTE of gate electrode layer 220 and the CTE of gate electrode layer 220 is higher than a CTE of gate dielectric layer 216. Thus, as a wafer comprising structure 200 cools down after gate electrode layer 222 has been deposited at high temperature, gate electrode layer 222 decreases in size to a greater extent than gate electrode layer 220 and gate electrode layer 220 decreases in size to a greater extent than gate dielectric layer 216. As a result, tensile strain is created in channel 212, which increases carrier mobility in FET 202. In one embodiment, FET 202 is a PFET while gate dielectric layer 216 and gate electrode layers 220 and 222 are selected such that gate dielectric layer 216 has a CTE that is higher than a CTE of gate electrode layer 220 and the CTE of gate electrode layer 220 is higher than a CTE of gate electrode layer 222. In such embodiment, compressive strain is created in channel 212, which increases carrier mobility in the PFET.

Figure 3:
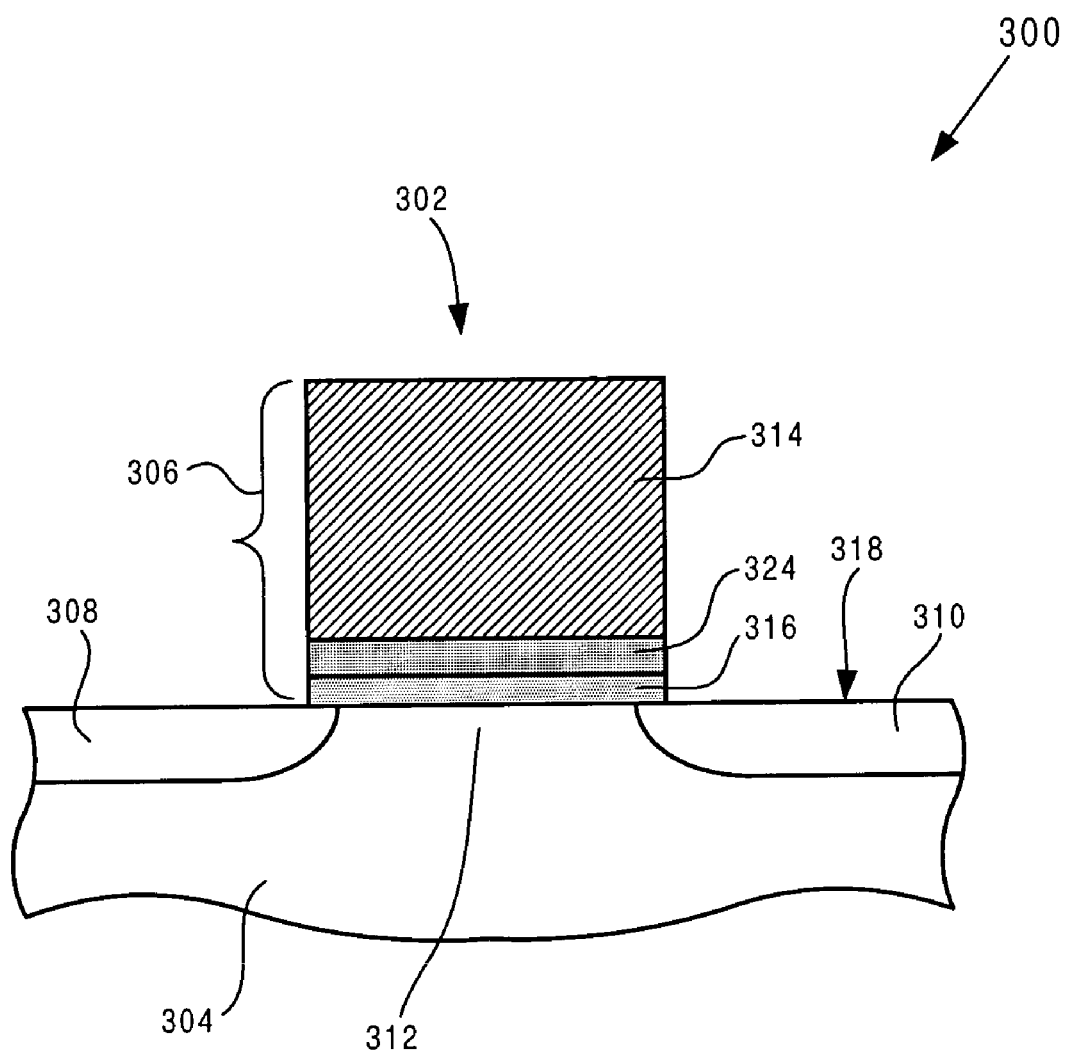
FIG. 3 illustrates a cross-sectional view of a structure, including an exemplary FET, in accordance with one embodiment of the present invention.

FIG. 3 shows a cross-sectional view of an exemplary structure including an exemplary FET in accordance with one embodiment of the present invention. Structure 300 includes FET 302, which is situated on substrate 304. FET 302 includes gate stack 306, which includes gate electrode layer 314 and gate dielectric layers 316 and 324, source 308, drain 310, and channel 312. Similar to FET 102, FET 302 can be an NFET or a PFET. In structure 300 in FIG. 3, substrate 304, source 308, drain 310, and channel 312 correspond, respectively, to substrate 104, source 108, drain 110, and channel 112 in structure 100.

As shown in FIG. 3, gate dielectric layer 316 is situated over channel 312 on top surface 318 of substrate 304 and may comprise silicon dioxide or other appropriate dielectric. Also shown in FIG. 3, gate dielectric layer 324 is situated over gate dielectric layer 316 and may comprise silicon nitride or other appropriate dielectric. Further shown in FIG. 3, gate electrode layer 314 is situated over gate dielectric 324. Gate electrode layer 314 can be deposited over gate dielectric layer 324 at high temperature utilizing a CVD process or other appropriate processes.

In the present embodiment, gate electrode layer 314 and gate dielectric layers 316 and 324 are selected such that gate electrode layer 314 has a higher CTE than a CTE of gate dielectric layer 324 and gate dielectric layer 324 has a higher CTE than a CTE of gate dielectric layer 316. Thus, as a wafer comprising structure 300 cools down after gate electrode layer 314 has been deposited at high temperature, gate electrode layer 314 is reduced in size to a greater extent than gate dielectric layer 324 and gate dielectric layer 324 is reduced in size to a greater extent than gate dielectric layer 316. As a result, tensile strain is created in channel 312, which increases carrier mobility in FET 302. In one embodiment, FET 302 is a PFET while gate dielectric layers 316 and 324 and gate electrode layer 314 are selected such that gate dielectric layer 316 has a CTE that is higher than a CTE of gate dielectric layer 324 and gate dielectric layer 324 has a higher CTE than a CTE of gate electrode layer 314. In such embodiment, compressive strain is created in channel 312, which increases carrier mobility in the PFET.

Figure 4:
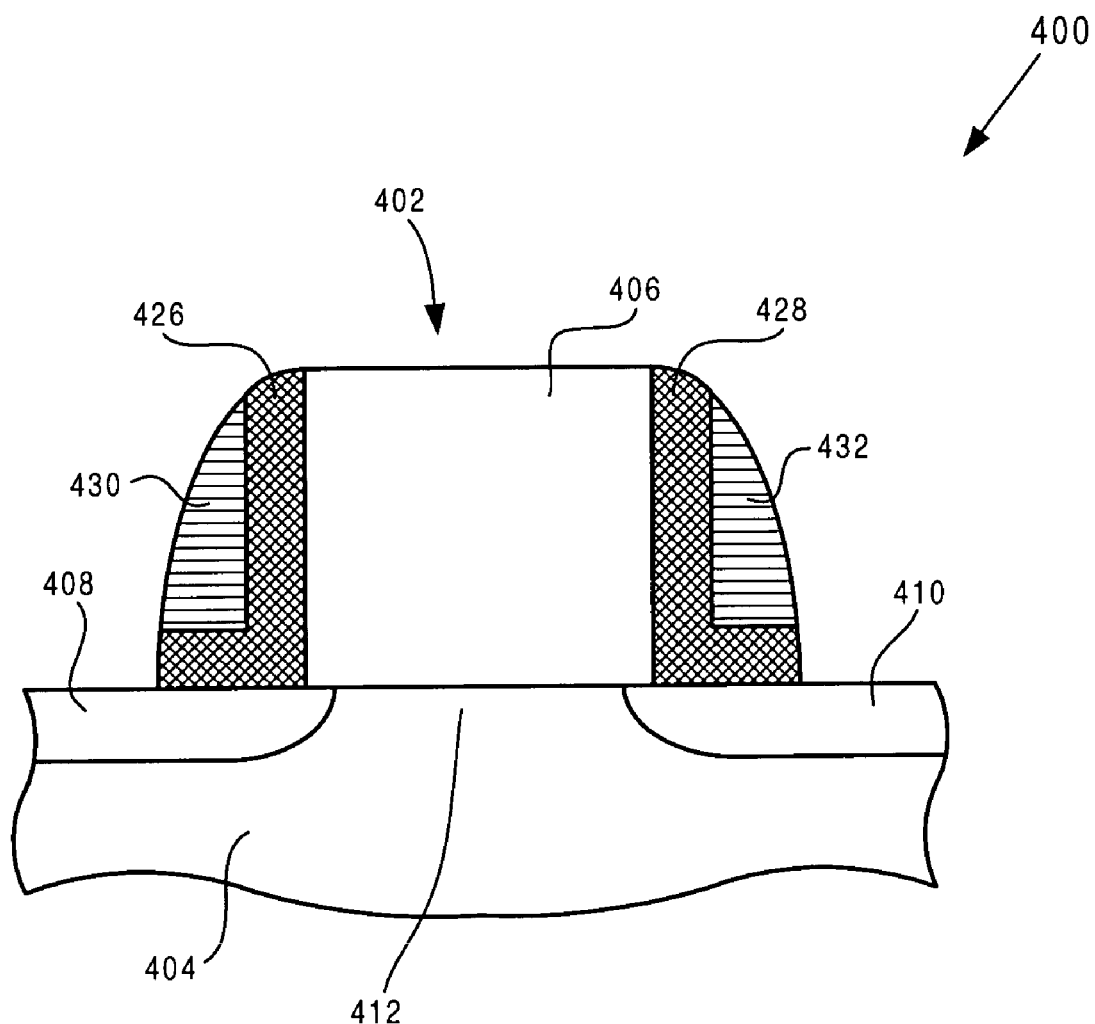
FIG. 4 illustrates a cross-sectional view of a structure, including an exemplary FET, in accordance with one embodiment of the present invention.

FIG. 4 shows a cross-sectional view of an exemplary structure including an exemplary FET in accordance with one embodiment of the present invention. Structure 400 includes FET 402, which is situated on substrate 404. FET 402 includes gate stack 406, source 408, drain 410, channel 412, "gate liner" 426 and "gate spacers" 428. Similar to FET 102, FET 402 can be an NFET or a PFET. In structure 400 in FIG. 4, substrate 404, source 408, drain 210, and channel 212 correspond, respectively, to substrate 104, source 108, drain 110, and channel 112 in structure 100.

As shown in FIG. 4, gate stack 406 is situated over substrate 404. Gate stack 406 can be gate stack 106 in FIG. 1, gate stack 206 in FIG. 2, or gate stack 306 in FIG. 3. Further shown in FIG. 4, gate liners 426 and 428 are situated over substrate 404 and are also situated adjacent to respective sides of gate stack 406. By way of example, gate liners 426 and 428 can have a thickness of between 50.0 Angstroms and 200.0 Angstroms. Also shown in FIG. 4, gate spacers 430 and 432 are situated adjacent to gate liners 426 and 428, respectively. Thus, gate liners 426 and 428 are situated between gate spacers 430 and 432 and sides of gate stack 406, respectively, and are also situated between respective gate spacers 430 and 432 and substrate 404.

In the present embodiment, gate liners 426 and 428 and gate spacers 430 and 432 are selected such that gate spacers 430 and 432 have respective CTEs that are higher than respective CTEs of gate liners 426 and 428. As a result, for similar reasons as discussed above, tensile strain is created in channel 412, which increases carrier mobility in FET 402. In one embodiment, FET 302 is a PFET while gate liners 426 and 428 and gate spacers 430 and 432 are selected such that gate liners 426 and 428 have respective CTEs that are higher than respective CTEs of gate spacers 430 and 432. As a result, compressive strain is created in channel 412, which increases carrier mobility in the PFET.

Thus as discussed above, by selecting gate electrode and dielectric layers of a gate stack to have appropriate respective coefficients of thermal expansion, the present invention achieves increased tensile strain in the channel of a FET, i.e. FETs 101, 102, 103, or 104. As a result, the present invention advantageously achieves increased carrier mobility in the FET, which results in increase FET performance. Additionally, by selecting gate electrode and dielectric layers of a gate stack to have appropriate respective coefficients of thermal expansion, the present invention achieves increased compression strain in the channel of a PFET, which results in increased carrier mobility and, consequently, increased performance in the PFET.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, field effect transistors ("FETs") having increased carrier mobility have been described.

The invention claimed is:

1. A FET situated over a substrate, said FET comprising:
a channel situated in said substrate;
a first gate dielectric situated over said channel, said first gate dielectric having a first coefficient of thermal expansion;
a first gate electrode situated over said first gate dielectric, said first gate electrode having a second coefficient of thermal expansion;
wherein said second coefficient of thermal expansion is different than said first coefficient of thermal expansion so as to cause an increase in carrier mobility in said FET;
a second gate electrode situated between said first gate electrode and said first gate dielectric, said second gate electrode having a third coefficient of thermal expansion, said third coefficient of thermal expansion being greater than said first coefficient of thermal expansion and said third coefficient of thermal expansion being less than said second coefficient of thermal expansion so as to cause a tensile strain in said channel, said tensile strain causing said increase in said carrier mobility.

2. A FET situated over a substrate, said FET comprising a channel situated in said substrate, a first gate dielectric situated over said channel, said first gate dielectric having a first coefficient of thermal expansion, a first gate electrode situated over said first gate dielectric, said first gate electrode having a second coefficient of thermal expansion, said FET being characterized in that:
said second coefficient of thermal expansion being different than said first coefficient of thermal expansion so as to cause an increase in carrier mobility in said FET;
a second gate electrode situated between said first gate electrode and said first gate dielectric, said second gate electrode having a third coefficient of thermal expansion, said third coefficient of thermal expansion being greater than said first coefficient of thermal expansion and said third coefficient of thermal expansion being less than said second coefficient of thermal expansion so as to cause a tensile strain in said channel, said tensile strain causing said increase in said carrier mobility.

3. A FET situated on a substrate, said FET comprising:
a channel situated in said substrate;
a gate stack situated over said channel;
a first gate dielectric situated in said gate stack, said first gate dielectric having a first coefficient of thermal expansion;
a first gate electrode situated over said first gate dielectric, said first gate electrode having a second coefficient of thermal expansion;
wherein said second coefficient of thermal expansion is different than said first coefficient of thermal expansion so as to cause a strain in said channel, said strain causing an increase in carrier mobility in said FET;
a second gate electrode situated between said first gate electrode and said first gate dielectric, said second gate electrode having a third coefficient of thermal expansion, said third coefficient of thermal expansion being greater than said first coefficient of thermal expansion and said third coefficient of thermal expansion being less than said second coefficient of thermal expansion so as to cause a tensile strain in said channel, said tensile strain causing said increase in said carrier mobility.

* * * * *